(12) United States Patent
Geens et al.

(10) Patent No.: US 6,815,711 B2
(45) Date of Patent: Nov. 9, 2004

(54) AMBIPOLAR ORGANIC TRANSISTOR

(75) Inventors: Wim Geens, Mechelen (BE); Jef Poortmans, Kessel-Lo (BE); Tom Aernouts, Tremelo (BE); Hieronymus Andriessen, Beerse (BE); Dirk Vanderzande, Hasselt (BE)

(73) Assignees: Interuniversitair Microelektronica Centrum (IMEC), Leuven (BE); Agfa Gevaert, Mortsel (BE)

( * ) Notice: Subject to any disclaimer, the term of this patent is extended or adjusted under 35 U.S.C. 154(b) by 0 days.

(21) Appl. No.: 10/281,385

(22) Filed: Oct. 23, 2002

(65) Prior Publication Data

US 2003/0085397 A1 May 8, 2003

(30) Foreign Application Priority Data

Oct. 24, 2001 (EP) ............................................. 01870226

(51) Int. Cl.$^7$ ............................................... H01L 51/40
(52) U.S. Cl. .......................... 257/40; 257/741; 257/750
(58) Field of Search .......................... 257/40, 741, 750; 438/99

(56) References Cited

U.S. PATENT DOCUMENTS

| | | | |
|---|---|---|---|
| 4,839,700 A | * 6/1989 | Ramesham et al. | ......... 361/500 |
| 5,596,208 A | 1/1997 | Dodabalapur et al. | |
| 5,629,530 A | 5/1997 | Brown et al. | |
| 6,326,640 B1 | 12/2001 | Shi et al. | |
| 6,441,395 B1 | * 8/2002 | Yu et al. | ......... 257/40 |
| 6,603,139 B1 | * 8/2003 | Tessler et al. | ......... 257/40 |
| 6,621,098 B1 | * 9/2003 | Jackson et al. | ......... 257/40 |
| 6,737,304 B2 | * 5/2004 | Yamazaki et al. | ......... 438/151 |

FOREIGN PATENT DOCUMENTS

| | | |
|---|---|---|
| EP | 0 716 459 A2 | 6/1996 |
| EP | 0 786 820 A2 | 7/1997 |
| EP | 1 306 909 A1 | * 2/2003 |

OTHER PUBLICATIONS

European Search Report for European Patent Application No. 02 44 7197, filed Feb. 28, 2003.
Balberg, et al., "Bipolar phototransport in π–conjugated polymer/$C_{60}$ composites", Applied Physics Letters, vol. 79, No. 2, pp. 197–199, (Jul. 9, 2001).
Brabec, et al., "Organic photovoltaic devices produced from conjugated polymer/methanofullerene bulk heterojunctions", Synthetic Metals, vol. 121, pp. 1517–1520, (Mar. 15, 2001).
Chemical Abstracts, Abstract No. 103075, vol. 124, No. 8, (Feb. 19, 1996).
Dodabalapur, et al., "Organic field–effect bipolar transistors", Applied Physics Letters, vol. 68, No. 8, pp. 1108–1110, (Feb. 19, 1996).
Geens, et al., "Field–effect mobility measurements of conjugated polymer/fullerene photovoltaic blends", Electronic Properties of Novel Materials–Molecular Nanostructures, pp. 516–520, (2000).

(List continued on next page.)

Primary Examiner—Sara Crane
(74) Attorney, Agent, or Firm—Knobbe Martens Olson & Bear LLP

(57) ABSTRACT

An organic field-effect transistor comprises source and drain electrodes formed separately from each other on a substrate, wherein the substrate comprises at least an organic semiconductor layer constituting a channel between the source and drain electrodes, an insulation layer underlying the organic semiconductor layer, and a gate electrode formed on the opposite side of the isolation layer. The organic semiconductor layer comprises hole and electron transporters, wherein the electron transporters comprise (6,6)-phenyl C61-butyric acid methyl ester (PCBM), and wherein the hole transporters comprise poly(2-methoxy-5-(3',7'-dimethyloctyloxy)-1,4-phenylene-vinylene)($OC_1C_{10}$-PPV) and/or poly(3-hexylthiophene) (P3HT).

24 Claims, 5 Drawing Sheets

OTHER PUBLICATIONS

Schön, et al., "Ambipolar pentacene field–effect transistors and inverters", Science, vol. 287, pp. 1022–1023, (Feb. 11, 2000).

Tada, et al., "Field–effect mobility of molecularly doped poly(3–hexylthiophene)", Jpn. J. Appl. Phys., vol. 36, part 2, No. 6A, pp. L718–L720, (Jun. 1, 1997).

European Search Report for European Patent Application No. 01870226.6, filed Oct. 24, 2001.

* cited by examiner

AMBIPOLAR ORGANIC TRANSISTOR

RELATED APPLICATION

This application claims priority to European Patent Application EP 01870226.6 entitled "AMBIPOLAR ORGANIC TRANSISTOR" and filed on Oct. 24, 2001. The disclosure of the above-described filed application is hereby incorporated by reference in its entirety.

BACKGROUND OF THE INVENTION

1. Field of the Invention

The invention relates generally to microelectronics, and more particularly, to organic field-effect transistors having an organic active layer material.

2. Description of the Related Technology

Organic transistors, and more particularly thin film field-effect transistors, continue to become more attractive in the field of electronics because of their low-cost deposition technologies and steadily improving performance. An organic field-effect transistor consists of materials ranging from conductors and semiconductors, to insulators. A transistor is namely p-channel if the majority charge carriers in the channel are positive (holes), and n-channel when the majority charge carriers in the channel are negative (electrons). Complementary circuits, such as complementary metal oxide semiconductors (CMOS), consist of both n-channel and p-channel transistors. These complementary circuits can be particularly useful due to advantages such as low static power dissipation and simple circuit design.

For fabrication of organic complementary circuits, the organic semiconducting p-channel and n-channel materials should exhibit relatively high and comparable mobility values for holes as well as for electrons. Ambipolar operation has been observed in organic field-effect transistors based on ultra-pure pentacene single crystals (Schön et al., Science, Vol. 287 (2000) p1022–1023). In the single crystals, which were grown by physical vapor transport in a stream of nitrogen, accumulation (p-type) and inversion (n-type) could be established.

However, low-cost solution-processable complementary circuits typically require the use of two different organic materials to obtain n-channel and p-channel transistors, since defects in these materials only allow unipolar charge transport.

There are several reasons why only a limited number of high performance n-channel organic semiconductors have been discovered so far, one of them is the fact that most organic materials tend to transport holes better than electrons and a large research effort is ongoing on electron transporters. An important difficulty in the field of organic transistors is finding a material which is not sensitive to oxygen, where oxygen is known to be an efficient trap for electrons.

Recent developments disclose organic transistor structures, comprising a mix of two active materials which enables p-channel and n-channel operations in the same device. An example of active materials exhibiting such properties are poly (3-hexylthiophene) (P3HT) and N,N'-bis (2,5-di-tert-butylphenyl)-3,4,9,10-perylene dicarboximide (BPPC) as hole and electron transporters, respectively, where currents of both polarities can be injected from the source and drain contacts. Tada et al., Jpn. J. Appl. Phys., Vol. 36 (1997) Pt. 2, No. 6A, L718. Such transistors are n-channel under positive gate bias and p-channel under negative gate bias. Hole and electron mobilities of respectively<$10^{-6}$ cm$^2$/(Vs) and<$10^{-7}$ cm$^2$/(Vs) were reported for P3HT doped with a 25 mol % concentration of BPPC.

In Applied Physical Letters, Vol. 79, No. 2, 9, July 2001, Balberg describes a fullerene ($C_{60}$)-polymer network composite structure showing a connectivity of a percolative $C_{60}$ network and, additionally, a connectivity of the polymer network. In Balberg's structure, the effect of the coupling phenomenon and the recombination kinetics depends on the molar fractions of both components.

In U.S. Pat. No. 5,629,530, Brown describes a solid state mixture of organic donor and acceptor molecules where difficulties are encountered in obtaining good balanced mobility values for holes and electrons transports in the organic donor/acceptor layer.

In U.S. Pat. No. 5,596,208, Dodabalapur describes organic field-effect transistors based on superposed evaporated organic n-type and p-type layers. In Dodabalapur's transistors, evaporated $C_{60}$ molecules are used as electron transporters in combination with Cr/Au bottom contacts. This technology leads to high production costs, which is a disadvantage for organic transistors as they are generally developed for low cost applications.

In 2000, Geens et. al (CP544, Electronic Properties of Novel Materials—Molecular Structures, ed. H. Kuzmany et al., American Institute of Physics, pages 516–520) reported field effect mobility measurements of organic field-effect transistors using an active region consisting of a conjugated polymer poly (2-methoxy-5-(3',7'-dimethyloctyloxy)-1,4-phenylene-vinylene (MDMO-PPV) blended with a soluble derivative of $C_{60}$ (6,6)-phenyl C61-butyric acid methyl ester (PCBM) in ratios of 1:2, 1:3, 1:4 and 1:10 with gold source and drain electrode, p-conducting silicon as the gate electrode, and a silica insulating layer. However, Geens et al. did not report any transistor with ambipolar properties.

Brabec at al. (Synthetic Metals, 2000, Volume 121, pages 1517–1520) reported bulk heterojunction photovoltaic devices based on a spin-coated blend of MDVO-PPV and PCBM. Devices with power efficiencies higher than 2.5% under AM1.5 were reported.

In response to the deficiencies in the above described devices, a network of organic molecules providing high balanced mobility values for holes and electrons combined to single top contacts for low-cost large scale organic ambipolar transistor productions would be beneficial in the technology.

SUMMARY OF CERTAIN INVENTIVE EMBODIMENTS

According to one aspect of the invention, an organic field-effect transistor comprises a source electrode, a drain electrode, wherein the source electrode and drain electrode are independent of one another located on a layered structure, an organic semiconductor layer forming a portion of the layered structure, an insulation layer underlying the organic semiconductor layer, and a gate electrode, underlying the insulation layer. The organic semiconductor layer comprises a channel between the source electrode and the drain electrode, and each of the source and drain electrodes comprises at least one of Au and (LiF and Al). The organic semiconductor layer further comprises hole and electron transporters, wherein the electron transporters comprise (6,6)-phenyl C61-butyric acid methyl ester (PCBM), and the hole transporters comprise at least one of poly (2-methoxy-5-(3', 7'-dimethyloctyloxy)-1, 4-phenylene-vinylene) (OC1C10-PPV), and poly (3-hexylthiophene) (P3HT).

In an additional aspect of invention, the organic semiconductor layer comprises traces of an organic solvent, or more specifically, traces of at least one organic solvent selected from the group consisting of chlorobenzene, 1,2 dichlorobenzene, and xylene.

According to another aspect of the invention, a method of manufacturing an organic field effect transistor comprises depositing an insulating layer on a gate electrode, depositing an organic semiconductor layer on the insulating layer, and forming a source electrode and a drain electrode on the organic semiconductor layer, wherein the source electrode and the drain electrode are formed independently of one another. The organic semiconductor layer comprises a mixture of at least two components, wherein a first component comprises (6,6)-phenyl C61-butyric acid methyl ester, wherein a second component comprises at least one of poly(2-methoxy-5-(3',7'-dimethyloctyloxy)-1,4-phenylene-vinylene)($OC_1C_{10}$-PPV) and poly(3-hexylthiophene) (P3HT), and wherein both the source and drain electrodes comprise at least one of Au and (LiF and Al).

In yet another aspect of the invention, the method further comprises forming the gate electrode on a substrate. The insulating layer may be $SiO_2$ layer, and forming the source and drain electrodes may comprise codeposition of Au and LiF in a weight ratio in the range of 1:10 to 10:1. In an additional aspect of the invention, the codeposition of Au and LiF can be followed by the deposition of an Al layer.

In yet another aspect of the invention, the organic semiconductor layer is deposited from a solution or dispersion in one or more organic solvents, or the organic semiconductor layer is deposited by spray-drying.

DETAILED DESCRIPTION OF CERTAIN INVENTIVE EMBODIMENTS

The following detailed description is directed to certain specific embodiments of the invention. However, the invention can be embodied in a multitude of different ways as defined and covered by the claims. In this description, reference is made to the drawings wherein like parts are designated with like numerals throughout.

Figure 1:
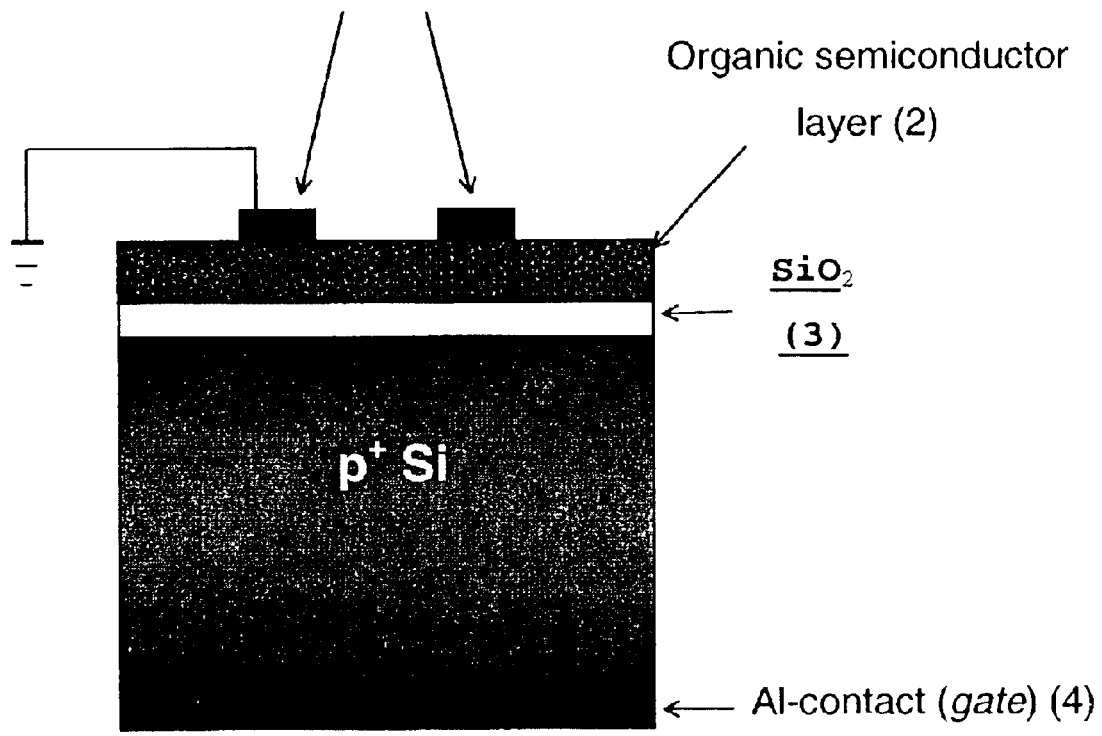
FIG. 1 is a device structure illustration of a thin film transistor with top source and drain electrodes, an organic semiconductor layer, an insulation layer, and a gate contact.
Figure 1:
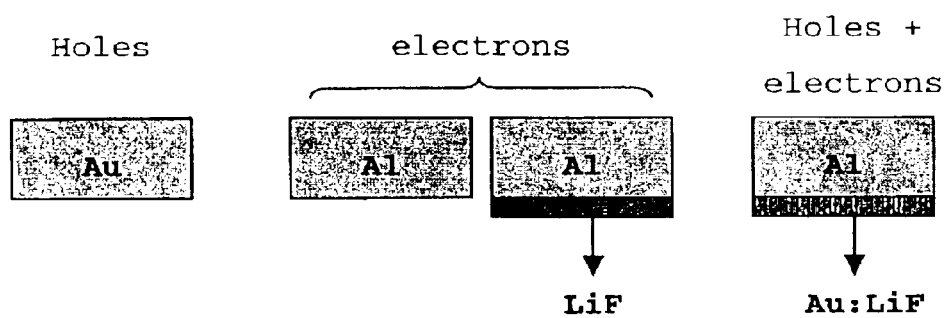

FIG. 1 is a structural illustration of one embodiment of an organic field-effect transistor. In FIG. 1, the gate electrode is a self-supporting piece of doped silicon coated with an insulating silica layer 3 on one side and contacted with aluminum gate contact 4 on the other. In a cleaning process, the $SiO_2$ surface is properly cleaned by immersing the substrate consecutively in heated acetone and heated IPA (isopropyl alcohol).

Following the cleaning process, a surface treatment of the $SiO_2$ layer 3 is performed by an oxygen plasma during 5 minutes at 200 W, followed by a HMDS (hexamethyldisilazane) treatment. This treatment leads to an extremely hydrophobic surface of the $SiO_2$ layer 3.

The self-supporting piece of doped silicon, coated with an insulating silica layer 3 on one side and contacted with aluminum gate contact 4 on the other, is then introduced into a nitrogen box where spin coating of the organic semiconductor layer 2 onto the insulating silica layer 3 is performed. The presence of nitrogen keeps oxygen and moisture out of the organic semiconductor layer [film] 2.

Figure 2:
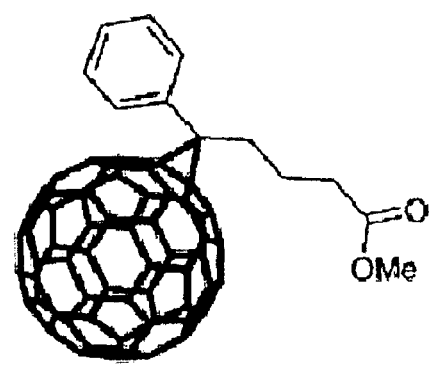
FIG. 2 is a molecular model of an electron transporter, (6,6)-phenyl $C_{61}$-butyric acid methyl ester,(PCBM).
Figure 3:
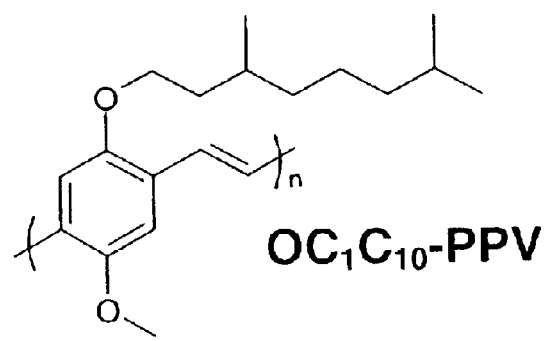
FIG. 3 is a molecular diagram of a hole transporter, poly(2-methoxy-5-(3',7'-dimethyloctyloxy)- 1,4-phenylene-vinylene), ($OC_1C_{10}$-PPV).
Figure 4:
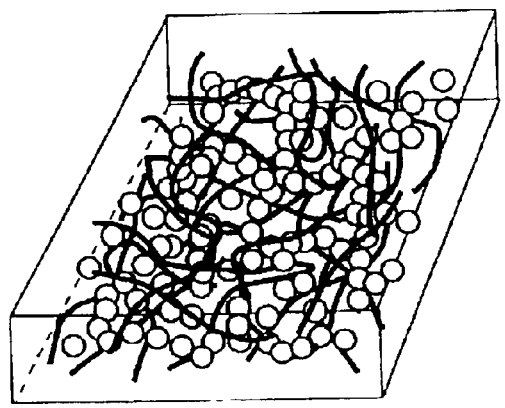
FIG. 4 is an illustration of the assembly of molecules in the organic layer, building some electron and hole transport channels.

The organic semiconductor layer 2 comprises hole and/or electron transporters. A modified soluble fullerene for spin coating applications, (6,6)-phenyl $C_{61}$-butyric acid methyl ester (PCBM), can be used as an electron transporter (FIG. 2). FIG. 3 is a model of a hole transporter, poly(2-methoxy-5-(3',7'-dimethyloctyloxy)-1,4-phenylene-vinylene), ($OC_1C_{10}$-PPV). FIG. 4 illustrates the assembly of molecules in the organic semiconductor layer, wherein some electron and hole transport channels are being formed.

Furthermore, the self-supporting piece of doped silicon, coated with an insulating silica layer on one side and contacted with aluminum gate contact 4 on the other, and now coated with the organic semiconductor layer 2, can be directly transferred from the nitrogen box to a metal deposition chamber so as to avoid formation of an insulating metal oxide layer at the interface between the organic semiconductor layer 2 and the evaporated metal.

The organic blends can be prepared by dissolving $OC_1C_{10}$-PPV and PCBM in a (1:4) weight ratio in an organic solvent, preferably, water-free chlorobenzene, water-free 1,2-dichlorobenzene, or xylene. In one embodiment, 5 mg of $OC_1C_{10}$-PPV and 20 mg of PCBM are dissolved in 1 ml of one of the above mentioned solvents. A magnetic stirring rod is added to the solution in a vessel and is kept stirring overnight at a temperature of 60° C.

The organic layer is formed by covering the $SiO_2$ layer 3 with the organic blend solution and spincoating the surface of the $SiO_2$ layer 3 for 40s at 1200 rpm, followed by 20s at 4000 rpm. This technique supplies organic layers of suitable thickness (100 to 200 nm) to the $SiO_2$ layer 3. A similar technique can be used for poly (3-hexylthiophene)(P3HT).

Following application of the organic layers, top electrodes 1 are evaporated through a shadow mask defining channel lengths ranging between about 30 microns and 200 microns and channel widths of about 2 mm or 10 mm.

Different types of top electrodes 1 can be formed:

For hole transport: Au(100 nm)

For electron transport: LiF(0.6 nm)/Al(120 nm)

For electron and hole transport: Au:LiF (0.6 nm)/Al(120 nm)

In the case of electron and hole transport, a very thin layer is formed by the co-evaporation of Au and LiF at an extremely low deposition rate, typically 0.1 Angstrom/sec or 10 pm/sec for Au as well as for LiF. In this way, a mixed layer of 0.6 nm Au:LiF can be formed in 30 seconds. After formation of the mixed layer, an Al layer of approximately 120 nm thickness is deposited.

The Au functions so as to form an ohmic contact with the highest occupied molecular orbital (HOMO) of $OC_1C_{10}$-PPV, resulting in a low injection barrier for the holes. A low injection barrier for the electrons into the lowest unoccupied (LUMO) of PCBM can be realized by depositing LiF/Al drain and source contact electrodes onto the organic blend. The co-deposition of Au and LiF, followed by the deposition of Al, combines these two properties.

After the construction of the different functional layers on the organic field-effect transistor, samples can be removed from the deposition chamber and measured in a flow of nitrogen.

In one exemplary test, FET characterization was performed using a HP4156A analyzer, with the source contact connected to ground. The measurement mode of the FET is determined by gate voltage, which induces an accumulation layer of charges in the region of the conduction channel adjacent to the interface with the $SiO_2$ layer 3.

For p-channel (or n-channel) operation, a negative (or positive) gate voltage is applied to induce an accumulation layer of holes (or electrons), allowing the measurement of the hole (or electron) mobility.

Figure 5A:
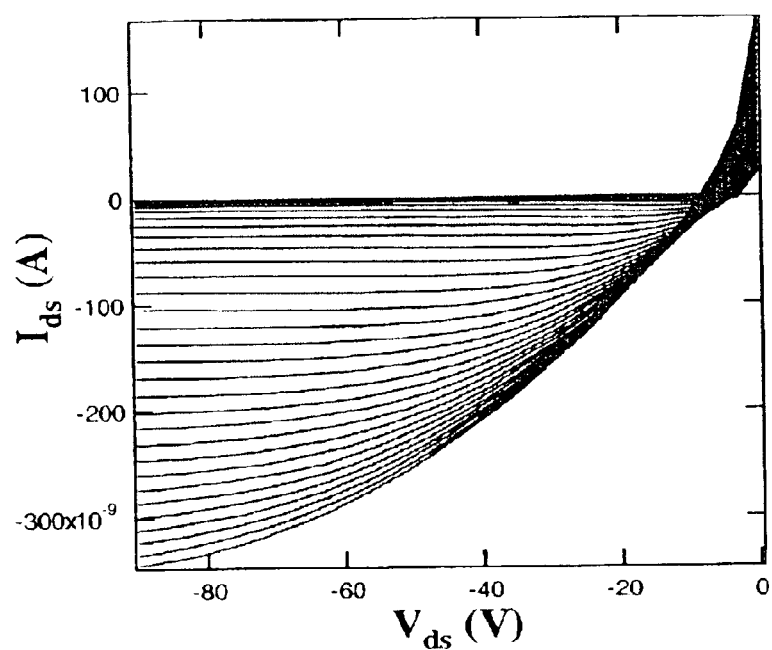
FIG. 5A is a graphical illustration of p-channel electrical characteristics of a field-effect transistor with an active layer of a (1:4) weight ratio blend of $OC_1C_{10}$-PPV: PCBM and Au top contacts.
Figure 5B:
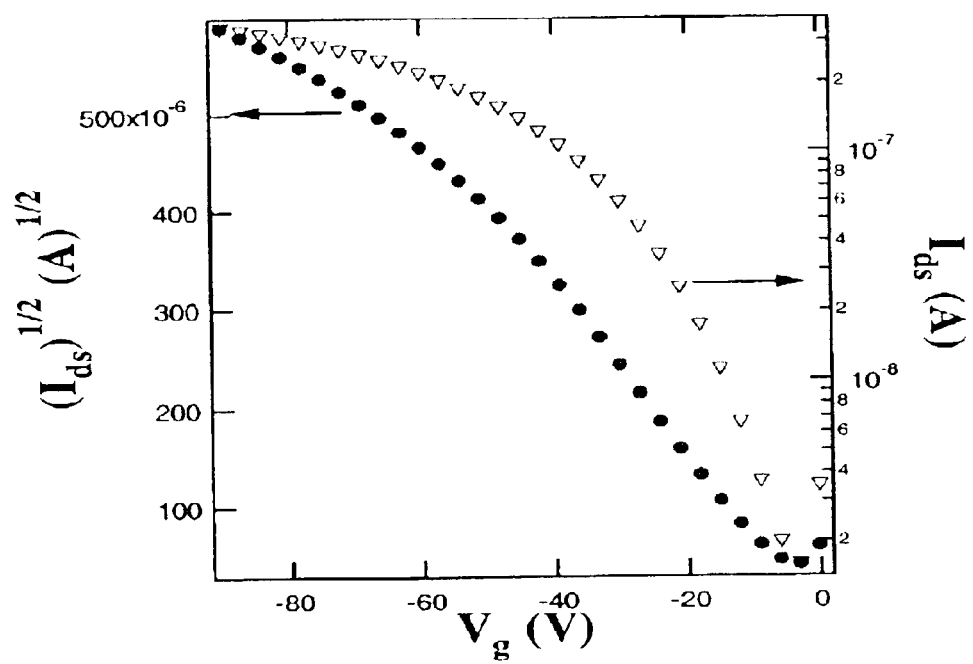
FIG. 5B is another graphical illustration of p-channel electrical characteristics of a field-effect transistor with an active layer of a (1:4) weight ratio blend of $OC_1C_{10}$-PPV: PCBM and Au top contacts.
Figure 6A:
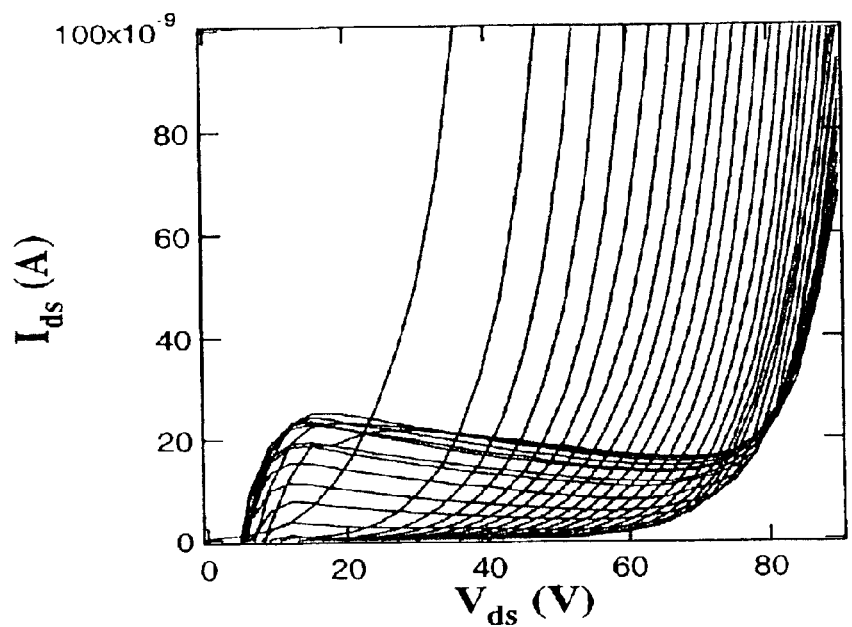
FIG. 6A is a graphical illustration of n-channel electrical characteristics of a field-effect transistor with an active layer of a (1:4) weight ratio blend of $OC_1C_{10}$-PPV: PCBM and Al top contacts.
Figure 6B:
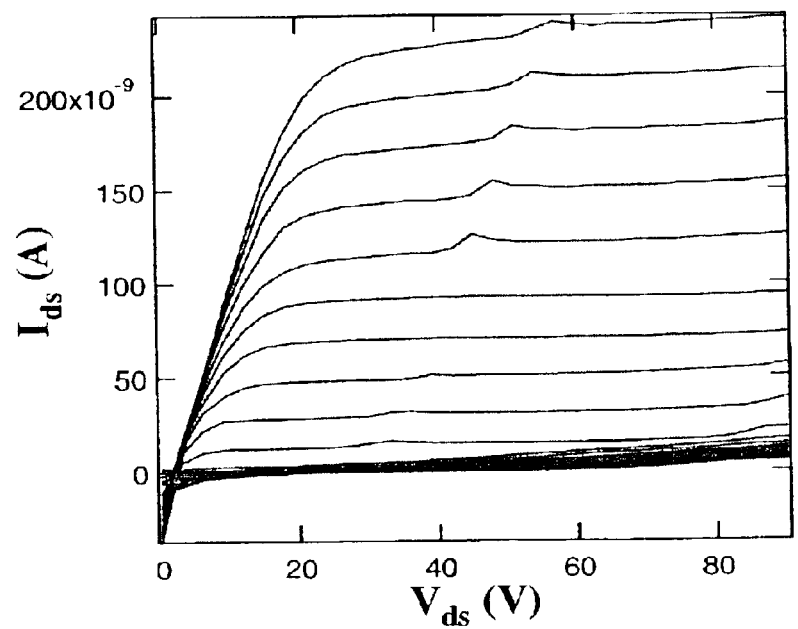
FIG. 6B is a graphical illustration of n-channel electrical characteristics of a field-effect transistor with an active layer of a (1:4) weight ratio blend of $OC_1C_{10}$-PPV: PCBM with LiF/Al top contacts.

The electrical characteristics of a p-channel FET with an active layer of a (1:4) weight ratio blend of $OC_1C_{10}$-PPV: PCBM and Au top contacts are illustrated in FIGS. 5A–B. The electrical characteristics of an n-channel FET with an active layer of a (1:4) weight ratio blend of $OC_1C_{10}$-PPV: PCBM and Al top contacts are illustrated in FIG. 6A, and improved electrical characteristics of an n-channel FET with an active layer of a (1:4) weight ratio blend of $OC_1C_{10}$-PPV: PCBM with LiF/Al top contacts is illustrated in FIG. 6B.

The field-effect mobilities $\mu_{FE}$ can be calculated from the saturation regime of the drain-source current ($I_{ds}$) using the following equation, where W and L are the conduction channel width and length, respectively, $C_{ox}$ is the capacitance of the insulating $SiO_2$ layer, $V_{gs}$ is the gate voltage, and $V_t$ is the threshold voltage:

$$I_{ds_{sat}} = \frac{\mu_{FE} W C_{ox}}{2L}(V_{gs}-V_t)^2 \quad (1)$$

Figure 7:
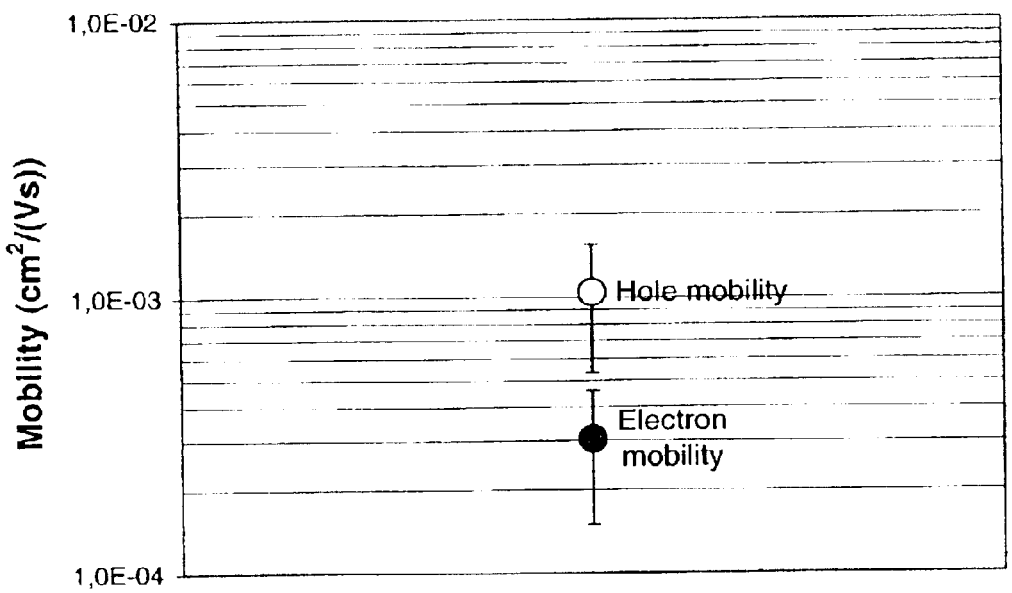
FIG. 7 is a graphical illustration of hole and electron mobilities in $OC_1C_{10}$-PPV: PCBM (1:4) weight ratio as determined from devices with Au top contacts and LiF/Al top contacts, respectively.

The following mobilities were determined for an organic field-effect transistor with Au source and drain electrodes of $1\times10^{-3}$ cm$^2$/Vs, and LiF/Al source and drain electrodes of $3\times10^{-3}$ cm$^2$/Vs, and are summarized in FIG. 7 with their respective error bars:

For the hole mobility, Au contacts→$\mu_h$=1×10$^{-3}$ cm$^2$/(Vs)

For the electron mobility, LiF/Al contacts→$\mu_e$=3×10$^{-4}$ cm$^2$/(Vs)

Figure 8:
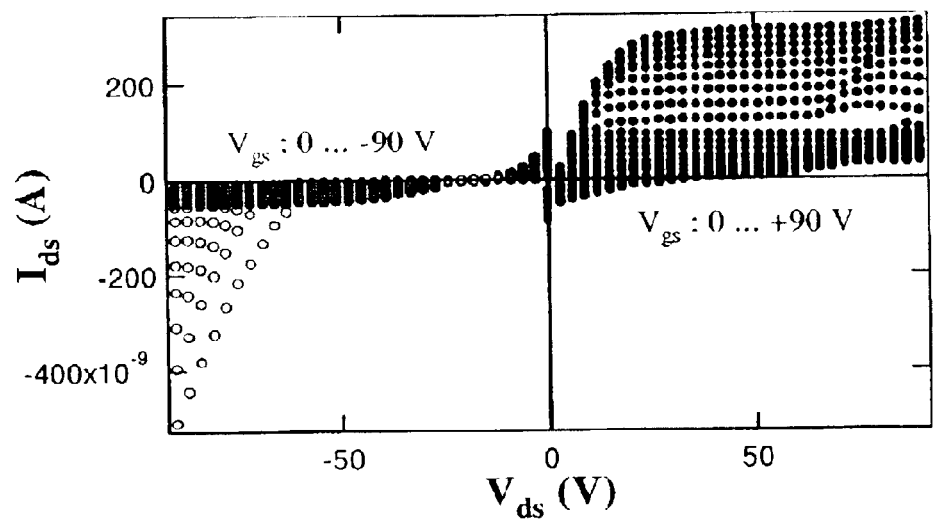
FIG. 8 is a graphical illustration of p-channel and n-channel electrical characteristics of a field-effect transistor with an active layer of a (1:4) weight ratio blend of $OC_1C_{10}$-PPV: PCBM with Au:LiF/Al top contacts.

For the hole and electron mobility at the same time, Au:LiF/Al with a (1:1) ratio for (Au:LiF), the field effect mobilities were determined to be $\mu_h$=2×10$^{-5}$ cm$^2$/(Vs) and $\mu_e$=2×10$^{-4}$ cm$^2$/(Vs). The electrical characteristics of such a transistor are illustrated in FIG. 8, wherein a thin layer of co-evaporated Au and LiF (represented as (Au:LiF)) in a (1:1) weight ratio was formed on top of the organic blend prior to the deposition of the Al electrode.

While the above detailed description has shown, described, and pointed out novel features of the invention as applied to various embodiments, it will be understood that various omissions, substitutions, and changes in the form and details of the device or process illustrated may be made by those skilled in the art without departing from the spirit of the invention. The scope of the invention is indicated by the appended claims rather than by the foregoing description. All changes which come within the meaning and range of equivalency of the claims are to be embraced within their scope.

What is claimed is:

1. An organic field-effect transistor, comprising:
    a source electrode;
    a drain electrode, wherein the source electrode and drain electrode are independent of one another and, located on a layered structure, the layered structure comprising an organic semiconductor layer having an upper surface that is in contact with at least one of the source electrode and drain electrode, wherein the organic semiconductor layer comprises a channel between the source electrode and the drain electrode and further comprises hole and electron transporters, and wherein the electron transporters comprise (6,6)-phenyl C61-butyric acid methyl ester (PCBM), and the hole transporters comprise at least one of poly (2-methoxy-5-(3', 7'-dimethyloctyloxy)-1, 4-phenylene-vinylene) ($OC_1C_{10}$-PPV) and poly (3-hexylthiophene) (P3HT); and
    an insulation layer underlying the organic semiconductor layer, wherein each of the source and drain electrodes comprises LiF.

2. The transistor of claim 1, wherein at least one of the source electrode and the drain electrode comprises Au and LiF in a weight ratio in the range of 1:10 to 10:1.

3. The transistor of claim 2, wherein at least one of the source electrode and the drain electrode comprises Au and LiF in a weight ratio in the range of 1:1 to 4:1.

4. The transistor of claim 1, wherein at least one of the source electrode and the drain electrode comprises codeposited Au and LiF.

5. The transistor of claim 4, wherein an Al layer is deposited on top of the codeposited Au/LiF layer.

6. The transistor of claim 1, wherein at least one of the source electrode and the drain electrode comprises an LiF/Al contact to the organic semiconductor layer.

7. The transistor of claim 1, wherein the organic semiconductor layer comprises a blend of $OC_1C_{10}$-PPV: PCBM in a weight ratio in the range 0.5:1 to 5:1.

8. The transistor of claim 1, wherein the organic semiconductor layer comprises traces of an organic solvent.

9. The transistor of claim 8, wherein the organic semiconductor layer comprises traces of at least one organic solvent selected from the group consisting of chlorobenzene, 1,2 dichlorobenzene, and xylene.

10. A method of manufacturing an organic field effect transistor, comprising:
    depositing an insulating layer on a gate electrode;
    depositing an organic semiconductor layer on the insulating layer, wherein the organic semiconductor layer comprises a mixture of at least two components, wherein a first component comprises (6,6)-phenyl C61-butyric acid methyl ester, and wherein a second component comprises at least one of poly(2-methoxy-5-(3′, 7′-dimethyloctyloxy -1,4-phenylene-vinylene) ($OC_1C_{10}$-PPV) and poly(3-hexylthiophene) (P3HT); and forming a source electrode and a drain electrode on an upper surface of the organic semiconductor layer, wherein the source electrode and the drain electrode are formed independently of one another, wherein each of the source and drain electrodes comprises LiF.

11. The method of claim 10, further comprising forming the gate electrode on a substrate.

12. The method of claim 10, wherein the insulating layer comprises a SiO2 layer.

13. The method of claim 10, wherein forming the source and drain electrodes comprises codeposition of Au and LiF in a weight ratio in the range of 1:10 to 10:1.

14. The method of claim 13, wherein the codeposition of Au and LiF is followed by the deposition of an Al layer.

15. The method of claim 10, wherein the organic semiconductor layer is deposited from a solution or dispersion in one or more organic solvents.

16. The method of claim 10, wherein the organic semiconductor layer is deposited by spray-drying.

17. A system for the manufacture of an organic field effect transistor, comprising:

means for depositing an insulating layer on a gate electrode;

means for depositing an organic semiconductor layer on the insulating layer, wherein the organic semiconductor layer comprises a mixture of at least two components, wherein a first component comprises (6,6)-phenyl C61-butyric acid methyl ester, and wherein a second component comprises at least one of poly(2-methoxy-5-(3′, 7′-dimethyloctyloxy)-1,4-phenylene-vinylene) ($OC_1C_{10}$-PPV) and poly(3-hexylthiophene) (P3HT); and means for forming a source electrode and a drain electrode on an upper surface of the organic semiconductor layer, wherein the source electrode and the drain electrode are formed independently of one another, and wherein each of the source and drain electrodes comprises LiF.

18. The system of claim 17, further comprising means for forming the gate electrode on a substrate.

19. The system of claim 17, wherein the insulating layer is comprises a SiO2 layer.

20. The transistor of claim 1, further comprising a gate electrode underlying the insulation layer.

21. The transistor of claim 1, wherein each of the source and drain electrodes comprises at least one of Au and (LiF and Al).

22. The transistor of claim 1, wherein each of the source and drain electrodes comprises codeposited LiF and Au and an Al top layer.

23. The method of claim 10, wherein both the source and drain electrodes comprise at least one of Au and (LiF and Al).

24. The method of claim 10, wherein each of the source and drain electrodes comprises codeposited LiF and Au and an Al top layer.

* * * * *